United States Patent [19]

Canonero

[11] Patent Number: 5,779,062
[45] Date of Patent: Jul. 14, 1998

[54] DEVICE FOR POSITIONING, LOCKING AND EXTRACTING MOBILE EQUIPMENT WITH RESPECT TO A FIXED SUPPORT

[75] Inventor: Roger Félix Canonero, Aix-En-Provence, France

[73] Assignee: Eurocopter France, Marignane Cedex, France

[21] Appl. No.: 763,149

[22] Filed: Dec. 10, 1996

[30] Foreign Application Priority Data

Dec. 12, 1995 [FR] France ................... 95 14705

[51] Int. Cl.⁶ ......................................... A47F 7/00
[52] U.S. Cl. ....................................... 211/26; 29/764
[58] Field of Search ................... 211/26; 29/758, 29/764

[56] References Cited

U.S. PATENT DOCUMENTS

| | | | |
|---|---|---|---|
| 3,100,931 | 8/1963 | Barnes | 29/764 |
| 3,696,492 | 10/1972 | Baillard | 29/203 |
| 4,223,934 | 9/1980 | Cauceglia et al. | 294/15 |

FOREIGN PATENT DOCUMENTS 71 47 203   8/1976   Germany.

*Primary Examiner*—Peter R. Brown
*Assistant Examiner*—Gerald A. Anderson
*Attorney, Agent, or Firm*—Henderson & Sturm

[57] ABSTRACT

Device for positioning, locking, and extracting mobile equipment with respect to a fixed support, of the type including two slideway elements 1, 2, one 1 of which is secured to the mobile equipment E and the other 2 of which is secured to the fixed support S, these elements 1, 2 being designed to guide the mobile equipment E in sliding on the fixed support S until complementary connectors secured on the one hand to the said equipment E and on the other hand to the said support S have been coupled together.

This device is characterized in that it includes removable insertion tooling comprising means 9, 11, 15 for temporarily catching hold of a load-spreading body 10 on the fixed slideway element 2, it being possible for a press screw 16 to be screwed into this load-spreading body 10 so as to exert, via its end 20, a thrust on the mobile slideway element 1.

8 Claims, 3 Drawing Sheets

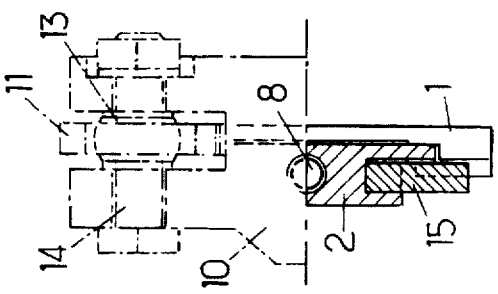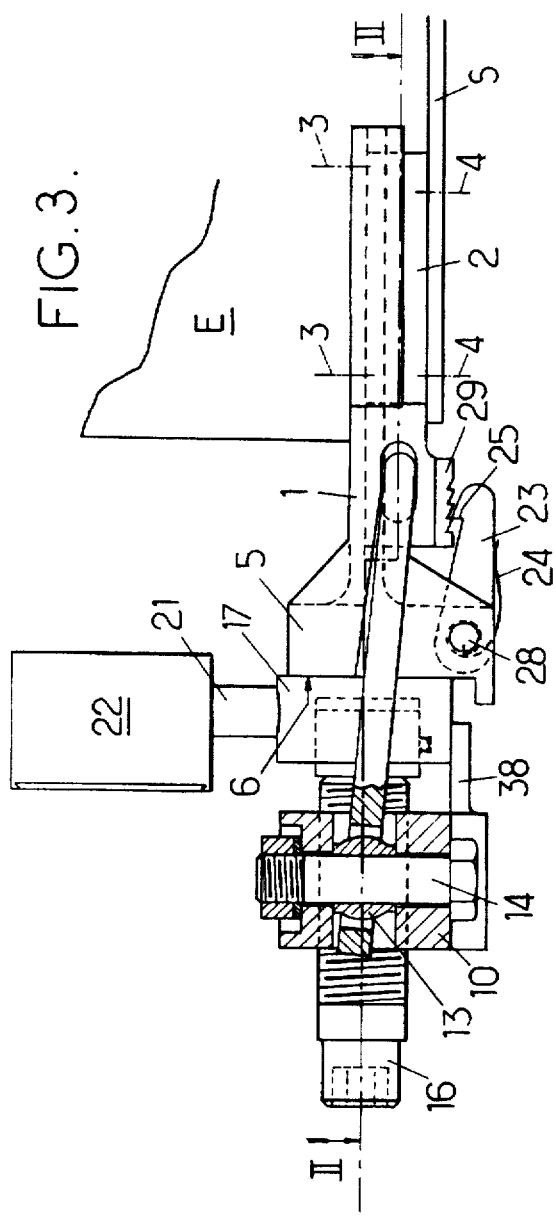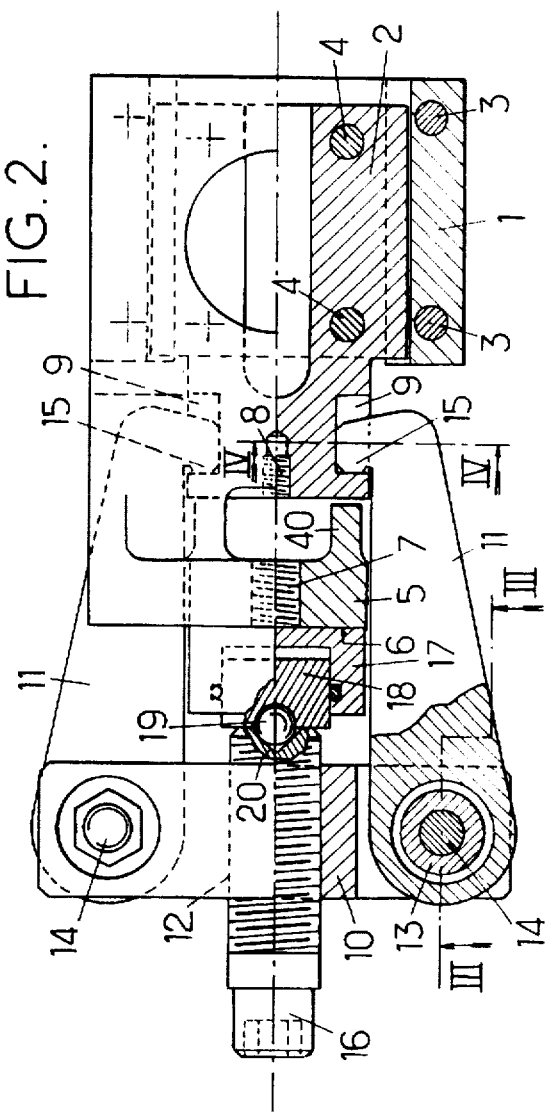

DEVICE FOR POSITIONING, LOCKING AND EXTRACTING MOBILE EQUIPMENT WITH RESPECT TO A FIXED SUPPORT

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present invention relates to a device for positioning, locking, and extracting mobile equipment with respect to a fixed support, of the type including two slideway elements, one of which is secured to the mobile equipment and the other of which is secured to the fixed support, these elements being designed to guide the mobile equipment in sliding on the fixed support until complementary connectors secured on the one hand to the said equipment and on the other hand to the said support have been coupled together.

BRIEF SUMMARY OF THE INVENTION

The mobile equipment could be a slot-in module containing electric or electronic circuits, for example for controlling or monitoring static or mobile industrial apparatus, land motor vehicles or aircraft, and the fixed support could form part of a cabinet or "rack" intended to be used on the ground or be fitted on board any appliance.

The positioning or extraction operation consists respectively in electrically connecting or disconnecting the said equipment by pushing it or by pulling it, while guiding it on the support by means of slideways. The locking operation consists in immobilizing the two slideway elements by securing them using a mechanical means in order to keep them connected.

The invention relates to equipment of any type for which accuracy and a controlled locking force are required, and relates mainly to complicated equipment in which the circuits of the slot-in module have to be connected to the exterior circuits arising on the cabinet by connectors with a high density of contacts, having several tens or even several hundreds of contacts, which requires great positional accuracy and also substantial force for coupling the male and female parts of the connectors in order to ensure good electrical operation and perfect mechanical robustness of the mobile equipment in all the phases of its operational use.

It is also necessary to be able to extract the slot-in module from its rack conveniently after having unlocked it, this being for reasons of maintenance or exchange.

Devices are known in which the functions of guidance, plugging-in and locking or unlocking are provided in a similar way for all of these functions. Their application (plugging-in and unplugging the connectors) mechanism is of the screw-nut, rack-pinion or excentric cam acting on a follower type. These mechanisms are based on the principle that the active parts are integral with one or other of the slideway elements. Such devices use the same guide elements (slideway) and the locking mechanisms form an integral part of the application system because of its static irreversibility; unlocking and unplugging or extraction take place by reversible action on the same mechanism. Such systems are inaccurate upon application, and this may detract from the correct operation of the equipment and also from the mechanical robustness of the support in the event of overloading. They have the drawback of forming an integral part of the guide system, and as a result of this there are as many mechanisms as there are equipment items and supports, which increases the purchase price and also the maintenance costs, parameters which are penalizing as far as industrial hardware is concerned. For systems fitted on board aircraft and particularly on board helicopters where mass is a major parameter in performance, increasing the number of these mechanisms results in making the hardware heavier.

The object of the present invention is therefore to satisfy the functions of positioning and of locking equipment while avoiding the drawbacks of increasing the number of mechanisms as mentioned hereinabove. For this purpose the invention is essentially based on the principle of separating the various functions just mentioned, and on specializing means or tools used to fulfil these functions, while at the same time making them just as easy to use on various hardware items to which they are not attached.

To this end, a device of the type defined at the beginning is, in accordance with the present invention, characterized in that it includes removable insertion tooling comprising means for temporarily catching hold of a load-spreading body on the fixed slideway element, it being possible for a press screw to be screwed into this load-spreading body so as to exert, via its end, a thrust on the mobile slideway element.

It will be necessary for it to be possible for this tooling to fit installations which differ, especially as regards their size.

To this end, the device may be further characterized in that the said catching means of the insertion tooling consist of a gripper, the two branches of which are articulated and/or ball-jointed to the said load-spreading body on each side of a tapped hole provided for the said press screw, and of which the opposite ends, in the shape of hooks, can be housed laterally in cavities provided on the opposed flanks of the said fixed slideway element.

It is therefore understood that the fixed slideway elements may have different widths, because the gripper of the catching means may be opened to greater or lesser extent depending on the widthwise dimensions of the installation, and will also be able to be oriented vertically depending on how high up are situated the cavities provided in the flanks of this fixed slideway element.

According to an additional provision of the invention, which is also attractive, provision may be made for the said insertion tooling to include, between the end of the said press screw and a bearing face of the said mobile slideway element, a hydraulic capsule connected to a pressure gauge which thus makes it possible to monitor the pressure exerted by the said screw on the bearing face of the mobile slideway element.

It is thus possible to ensure that no excessive pressure is exerted on the mobile slideway element during final positioning, which excessive pressure could detract from the preservation of the mechanical and electrical qualities of the connectors.

According to another provision of the invention, the end of the said press screw is designed to press a piston of the said hydraulic capsule, which can move in the capsule body, by means of a ball crimped into the end of the said piston, so that having the insertion tooling slightly off-axis with respect to the mobile element of the slideway presents no drawback, the presence of the ball preventing the appearance of lateral stresses which may detract from the correct operation of this slideway.

To avoid the mobile equipment springing back slightly after it has been positioned, and before definitive locking has been carried out, the device may be further characterized in that the insertion tooling further includes means of temporary locking which are capable of temporarily blocking the relative position of the mobile slideway element with respect to the fixed slideway element once their relative terminal position has been reached, and before the said tooling is withdrawn prior to the final locking operation. It will thus be possible, for example, to use means of temporary locking with a rack or with a peg.

As far as the definitive locking means are concerned, they may comprise, for example, a locking screw which can be screwed into a tapped hole in the fixed slideway element after it has passed through a tapped hole of larger diameter in the mobile slideway element, the head of this screw resting against a bearing face of the said mobile slideway element.

After the temporary locking and definitive locking have been eliminated, the mobile equipment may be extracted, for example for maintenance or exchange, using an extraction screw which can be screwed into the said tapped hole in the mobile slideway element and bear via its end on a bearing face of the said fixed slideway element.

BRIEF DESCRIPTION OF SEVERAL VIEWS OF THE DRAWINGS

The invention will now be explained in greater detail via the description of one non-limiting embodiment, with reference to the figures of the drawing appended hereto, in which:

FIG. 2 is a view in horizontal half section of these same elements equipped with the insertion tooling, on the line II—II of FIG. 3;

FIG. 3 is a view in elevation of the device of FIG. 2, with vertical part section on the line III—III of FIG. 2;

FIG. 4 is a view in vertical half section on the line IV—IV of FIG. 2;

DETAILED DESCRIPTION OF THE INVENTION

Figure 5:
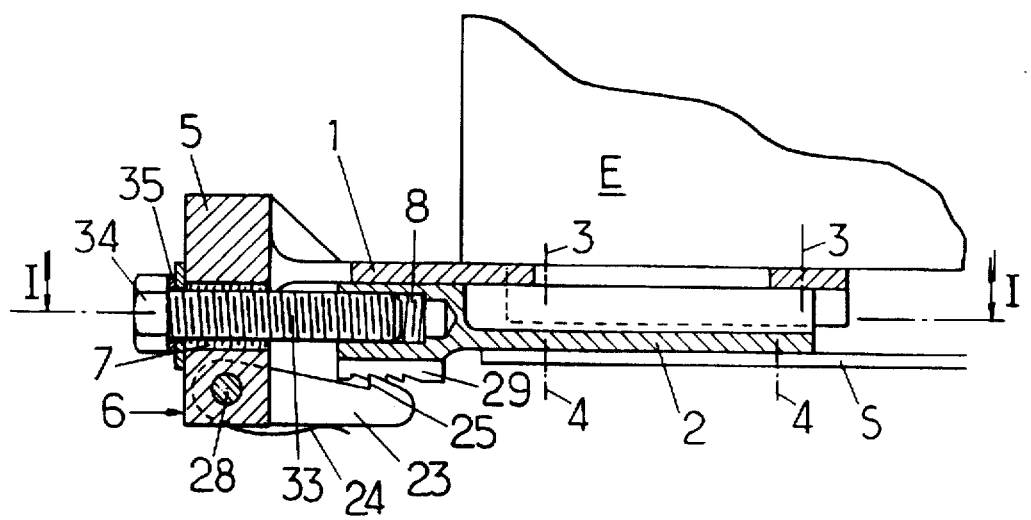
FIG. 5 is a view in vertical section on the line V—V of FIG. 1, showing means of temporary locking of the rack type (also visible in FIG. 3)

Referenced as 1 and 2 in the various figures are the slideway elements, respectively a female element secured to the bottom of mobile equipment E by screws 3 and a fixed male element secured to a cabinet support S by screws 4. The mobile female element 1 of the slideway at its end outside the equipment E includes a projecting head 5 which towards the front has a bearing face 6 and through which a tapped hole 7 passes.

Figure 1:
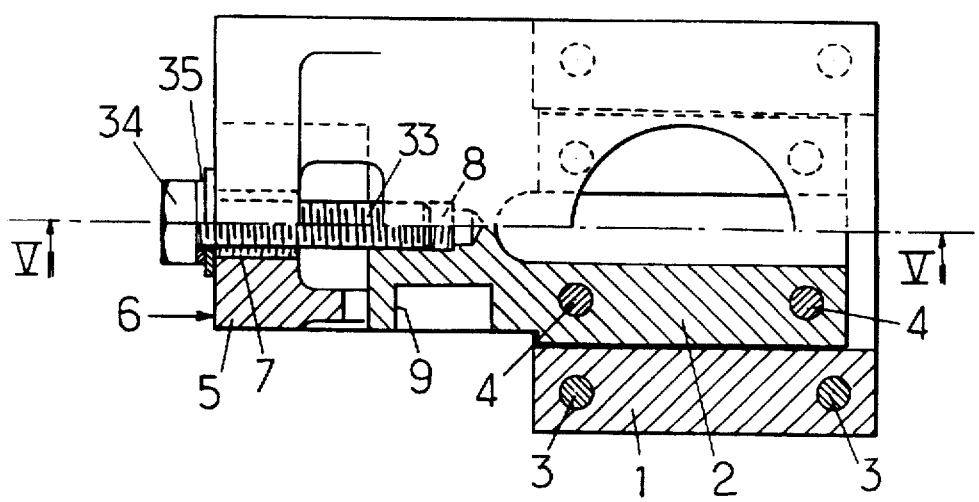
FIG. 1 represents a view in horizontal half section of the two slideway elements of the device, on the line I—I of FIG. 5, in the final mutually-locked position.

The fixed male element 2 of the slideway itself also, on its front face, has a tapped hole 8 passing through it, this hole having a smaller diameter than the hole 7, and on its flanks has two cavities 9 (FIG. 1).

The insertion tooling (FIGS. 2 and 3), the main characteristic of which is that it is removable and can be fitted to various configurations of installation, includes a load-spreading body 10 to which the two branches 11 of a catching gripper are articulated; these branches are articulated, on each side of a central tapped hole 12, on ball joints 13 borne by two bolts serving as vertical load-take up rods 14, this being to allow the branches a certain amount of play in all directions relative to the body 10. At their free ends, these two branches have hooks 15 capable of engaging respectively in the abovementioned cavities 9 of the fixed male element 2.

It is therefore thanks to the load-spreading body 10 thus equipped and thanks to a press screw 16 engaged in the tapped hole 12 that it is possible to exert an insertion pressure on the front bearing face 6 of the female slideway element (driving the equipment E along), the backward movement of the tooling then being prevented by the hooks 15 being caught in the cavities 9 of the fixed slideway element 2.

In order to be able to monitor this insertion pressure, a hydraulic capsule 17 borne by an appendage 38 of the body 10 is arranged between the end of the screw 16 and the bearing face 6, the piston 18 of this capsule carrying a crimped ball 19 over which a V-shaped groove 20 in the end of the screw can sit. In that way, it is of no consequence that the insertion tooling may be slightly off-axis with respect to the mobile element 1 of the slideway, the presence of the ball 19 preventing this resulting in stresses or risk of jamming at the slideway.

The hydraulic capsule 17 is connected by a coupling 21 to a pressure gauge 22, this making it possible to avoid inadvertently exerting on the element 1, when tightening the screw 16, an excessive load which may harm the connectors borne respectively by the mobile equipment E and by the cabinet carrying the fixed support S. The fixed and mobile elements of the slideway resting against each other 40 in any case provides end-of-travel safety (FIG. 2).

When the equipment E has thus been inserted, the equipment having reached its final position, it may be opportune to employ temporary locking to make it possible, before carrying out definitive locking, to withdraw the insertion tooling without springback, owing to an elastic effect, of the mobile equipment E and therefore of the female slideway element 1.

Figure 7:
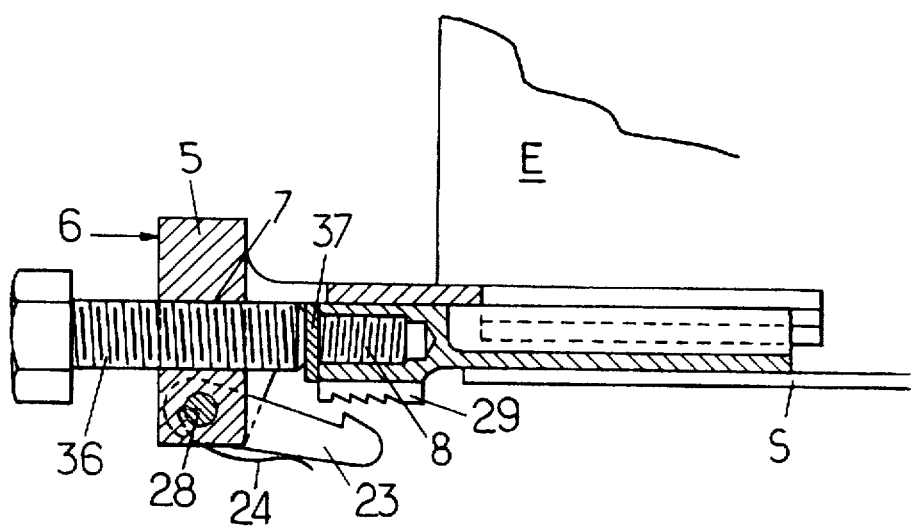
FIG. 7 is a view in vertical section similar to that of FIGS. 5 and 6, showing screw-type extraction means.

To achieve this, it is possible, for example, to use means of temporary locking with a rack like those represented in FIGS. 3, 5 and 7, and which call upon a pivoting lever 23 mounted on the head 5 of the element 1 (pivot pin 28) urged upwards by a leaf spring 24, and a hook 25 of which may snap-fit into one of the teeth of a rack 29 fixed under the fixed male element 2 of the slideway.

By way of an alternative (FIG. 6) it is possible to insert a peg 30 which can be jammed into two opposing holes 31 of the male element 2 and 32 of the female element 1 of the slideway.

When the element for temporary locking is in place (FIG. 5 or 6) the insertion tooling may be withdrawn and definitive locking carried out.

Figure 6:
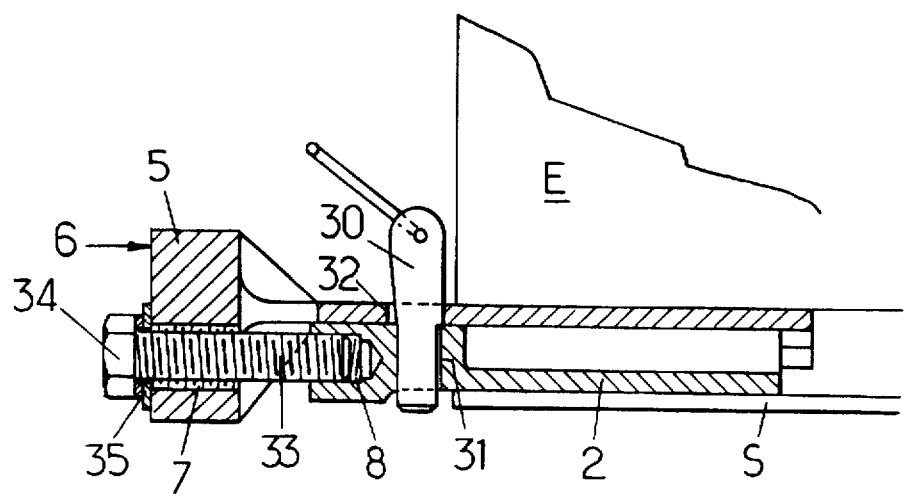
FIG. 6 is a view similar to that of FIG. 5 showing by way of alternative means of temporary locking of the peg type.

To do this, all that is required is for there to be engaged, in the tapped hole 7 of the projecting head 5 of the female element 1 of the slideway, a screw 33 (which does not engage with the tapping of this hole) and for this screw to be screwed into the smaller-diameter tapped hole 8 of the male element 2. By bearing on the bearing face 6, via a locking washer 35, the head 34 of this screw will prevent any backward travel of the element 1 (FIGS. 1, 5 and 6).

In order to extract the slot-in module or the like constituting the mobile equipment E, all that will be required, after elimination of the temporary locking, will be to screw into the tapped hole 7 another screw 36, the end of which will come to rest via a small plate 37 (protecting the orifice of the tapped hole 8) on the front face of the male slideway element 2. It will be understood that screwing this screw 36 in will therefore cause the female element 1 to move back, by means of its projecting head 5.

What is claimed is:

1. A device for positioning and extracting mobile equipment with respect to a fixed support comprising two slideway elements, one of said two slideway elements being secured to the mobile equipment and the other of said two slideway elements being secured to the fixed support, for guiding the mobile equipment slideably along the fixed support until complementary connectors, secured to said mobile equipment and to said fixed support, have been coupled together; removable insertion tooling comprising catching means for temporarily catching hold of a load-spreading body on said other of said two slideway elements; and a press screw adapted to be screwed into said load-spreading body to exert, via an end, a thrust on said one of said two slideway elements; locking means comprising a locking screw adapted to be screwed into a tapped hole in said other of said two slideway elements after said locking screw has passed said one of said two slideway elements, said locking screw comprising a head for resting against a bearing face of said one of said two slideway elements.

2. A device according to claim 1, comprising means for extracting the mobile equipment, said means for extracting comprising an extraction screw for screwing into said tapped hole in said one of said two slideway elements and bearing via an end on a bearing face of said other of said two slideway elements.

3. A device according to claim 1, wherein said catching means of the removable insertion tooling comprises a gripper comprising two branches which are ball-jointed to said load-spreading body on each side of a tapped hole for receiving said press screw, and an opposite end, in the shape of hooks, adapted to be housed laterally in cavities provided on opposed flanks of said other of said two slideway elements.

4. A device according to claim 1, wherein said removable insertion tooling comprises means for temporary locking for temporarily blocking a relative position of said one of said two slideway elements once a relative terminal position has been reached, and before said removable insertion tooling is withdrawn prior to a final locking operation.

5. A device according to claim 4, wherein said means for temporary locking comprises a rack.

6. A device according to claim 4, wherein said means for temporary locking comprises a peg.

7. A device according to claim 1, wherein said removable insertion tooling comprises, between an end of said press screw and a bearing face of said one of said two slideway elements, a hydraulic capsule connected to a pressure gauge for monitoring pressure exerted by said press screw on a bearing face of said one of said two slideway elements.

8. A device according to claim 7, wherein an end of said press screw is adapted to press a piston of said hydraulic capsule, moveably disposed in a capsule body, by means of a ball crimped into an end of said piston.

* * * * *